(12) United States Patent
Pertijs

(10) Patent No.: US 7,834,685 B1
(45) Date of Patent: Nov. 16, 2010

(54) CHOPPED AUTO-ZEROED PING-PONG AMPLIFIER AND RELATED APPARATUS, SYSTEM, AND METHOD

(75) Inventor: Michiel Antonius Petrus Pertijs, 's Hertogenbosch (NL)

(73) Assignee: National Semiconductor Corporation, Santa Clara, CA (US)

( * ) Notice: Subject to any disclaimer, the term of this patent is extended or adjusted under 35 U.S.C. 154(b) by 83 days.

(21) Appl. No.: 12/287,947

(22) Filed: Oct. 15, 2008

Related U.S. Application Data

(60) Provisional application No. 61/192,446, filed on Sep. 18, 2008, provisional application No. 61/192,404, filed on Sep. 18, 2008.

(51) Int. Cl.
*H03F 1/02* (2006.01)
(52) U.S. Cl. .......................... 330/9; 327/124
(58) Field of Classification Search ............... 330/9, 330/69, 12 R, 295; 327/124, 307
See application file for complete search history.

(56) References Cited

U.S. PATENT DOCUMENTS

| | | |
|---|---|---|
| 5,155,447 A | 10/1992 | Huijsing et al. |
| 5,204,557 A | 4/1993 | Nguyen |
| 5,896,044 A | 4/1999 | Walden |
| 6,104,732 A | 8/2000 | Pearman |
| 6,373,285 B1 | 4/2002 | Konishi |
| 6,377,200 B1 * | 4/2002 | Lee ............................ 341/155 |
| 6,476,671 B1 | 11/2002 | Tang |
| 6,498,530 B1 * | 12/2002 | Tang ............................ 330/9 |
| 6,538,503 B2 | 3/2003 | Burt |
| 6,653,895 B1 * | 11/2003 | Douts et al. ................... 330/9 |
| 7,181,635 B2 | 2/2007 | Byrne et al. |
| 7,573,327 B1 | 8/2009 | Pertijs et al. |
| 7,584,314 B1 | 9/2009 | Sauerwald |
| 2003/0142233 A1 | 7/2003 | Eckhardt et al. |
| 2004/0008725 A1 | 1/2004 | McNamara et al. |
| 2005/0275460 A1 | 12/2005 | Botker |
| 2006/0176109 A1 | 8/2006 | Huijsing et al. |
| 2008/0284507 A1 | 11/2008 | Pertijs et al. |

OTHER PUBLICATIONS

"Faraday SerDes IP, Universal Programmable SerDes IP," Faraday, 2 pages, 2006.

"Serial Digital Interface Reference Design for Cyclone & Stratix Devices," Altera Corporation, Aug. 2004, ver. 1.1, 14 pages.

(Continued)

*Primary Examiner*—Khanh V Nguyen

(57) ABSTRACT

An apparatus includes a plurality of amplifier stages configured to receive an input voltage and generate an amplified output current. Each amplifier stage includes a transconductance stage configured to receive the input voltage and generate a first intermediate output current. Each amplifier stage also includes an auto-zeroing loop configured to generate a second intermediate output current that at least partially corrects for an offset of the transconductance stage, where the auto-zeroing loop operates at a first frequency. Each amplifier stage further includes chopping circuitry configured to reverse a polarity of the input voltage and a polarity of the amplified output current at a second frequency, where the second frequency is less than the first frequency. Each amplifier stage is configured to operate in auto-zeroing and amplification phases. At least one amplifier stage operates in the auto-zeroing phase when at least one other amplifier stage operates in the amplification phase.

20 Claims, 11 Drawing Sheets

OTHER PUBLICATIONS

"3G, HD & SD Dual Output Cable Equalizer," Mindspeed Technologies, Inc., 2006, 2 pages.

Dave Bursky, "FPGA Combines Multiple Serial Interfaces and Logic," Electronic Design, Oct. 2, 2000, 5 pages.

"LMH0002, SMPTE 292M/259M Serial Digital Cable Driver," National Semiconductor Corporation, Oct. 2006, 6 pages.

"LMH0034, SMPTE 292M/259M Adaptive Cable Equalizer," National Semiconductor Corporation, Jun. 2006, 7, pages.

"SCAN25100, 2457.6, 1228.8, and 614.4 Mbps CPRI SerDes with Auto RE Sync and Precision Delay Calibration Measurement," National Semiconductor Corporation, Nov. 2006, 14 pages.

"LMH0040, 5:1 Serial Digital Video Serializer and Driver," National Semiconductor Corporation, Oct. 24, 2006, 11 pages.

"LMH0041, 1:5 Serial Digital Video Deserializer with Loopthrough," National Semiconductor Corporation, Dec. 1, 2006, 12 pages.

LMH0046, HD/SD/ SDI Reclocker with Dual Differential Outputs, National Semiconductor Corporation, Jul. 2006, 12 pages.

Michael Kultgen, "Simple, Precise Instrumentation Amplifier Features Digitally Programmable Gains from 1 to 4096", Linear Technology Magazine, Mar. 2005, p. 16-19.

"Zero Drift, Precision Instrumentation Amplifier with Digitally Programmable Gain", Linear Technology Corporation 2004, p. 1-16.

"LMP8100 Programmable Gain Amplifier", National Semiconductor Corporation, Apr. 18, 2008.

A. Paul Brokaw, et al., "An Improved Monolithic Instrumentation Amplifier", IEEE Journal of Solid-State Circuits, vol. SC-10, No. 6, Dec. 1975, p. 417-423.

Robert C. Yen, et al., "A MOS Switched-Capacitor Instrumentation Amplifier", IEEE Journal of Solid-State Circuits, vol. SC-17, No. 6, Dec. 1982, p. 1008-1013.

Christian C. Enz, et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, p. 1584-1614.

Rob Burt, et al., "A Mocropower Chopper-Stabilized Operational Amplifier Using a SC Notch Filter with Synchronous Integration Inside the Continous-Time Signal Path", IEEE Journal of Solid-State Circuits, vol. 41, No. 12, Dec. 2006, p. 2729-2736.

Christian Menolfi, et al., "A Fully Integrated, Untrimmed CMOS Instrumentation Amplifier with Submicrovolt Offset", IEEE Journal of Solid-State Circuits, vol. 34, No. 3, Mar. 1999, p. 415-420.

Ivars G. Finvers, et al., "Noise Analysis of a Continous-Time Auto-Zeored Amplifier", IEEE Transactions on Circuit and Systems—II: Analog and Digital Processing, vol. 43, No. 12, Dec. 1996, p. 791-800.

Ion E. Opris, et al., "A Rail-to-Rail Ping-Pong Op-Amp", IEEE Journal of Solid-State Circuits, vol. 31, No. 9, Sep. 1996, pg. 1320-1324.

Andrew T.K. Tang, "A 3μV-Offset Operational Amplifier with 20nV/√Hz Input Noise PSD at DC Employing both Chopping and Autozeroing", 2002 IEEE International Solid-State Circuits Conference, 2 pages.

A. Bakker, et al., "A CMOS Chopper Opamp with Integrated Low-Pass Filter", Proc. ESS CIRC, Sep. 1997, p. 200-203.

Bernard J. van den Dool, et al., "Indirect Current Feedback Instrumentation Amplifier with a Common-Mode Input Range that Includes the Negative Rail", IEEE Journal of Solid-State Circuits, vol. 28, No. 7, Jul. 1993, p. 743-749.

David J. Willis, et al., "Zero CVF Input Current Switched-Capacitor Instrumentation Amplifier", 2005 IEEE, p. 1255-1258.

Eduard Sackinger, et al., "A Versatile Building Block: The CMOS Differential Difference Amplifier", IEEE Journal of Solid-State Circuits, vol. SC-22, No. 2, Apr. 1987, p. 287-294.

* cited by examiner

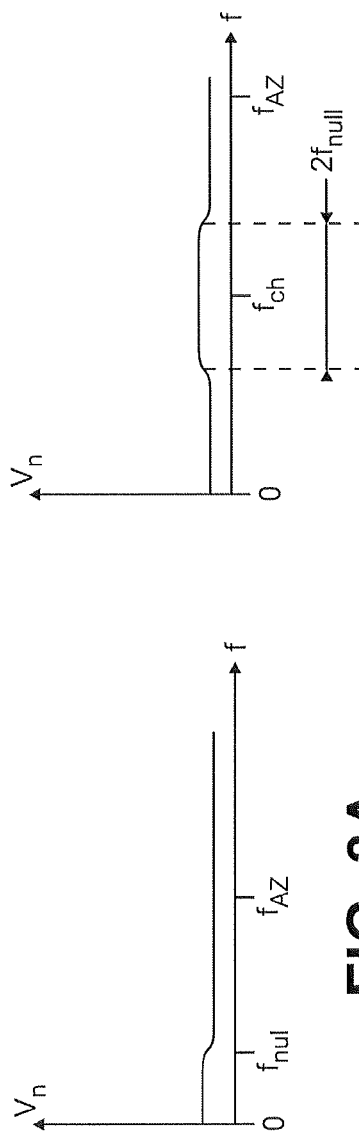
FIG. 3A
FIG. 3B
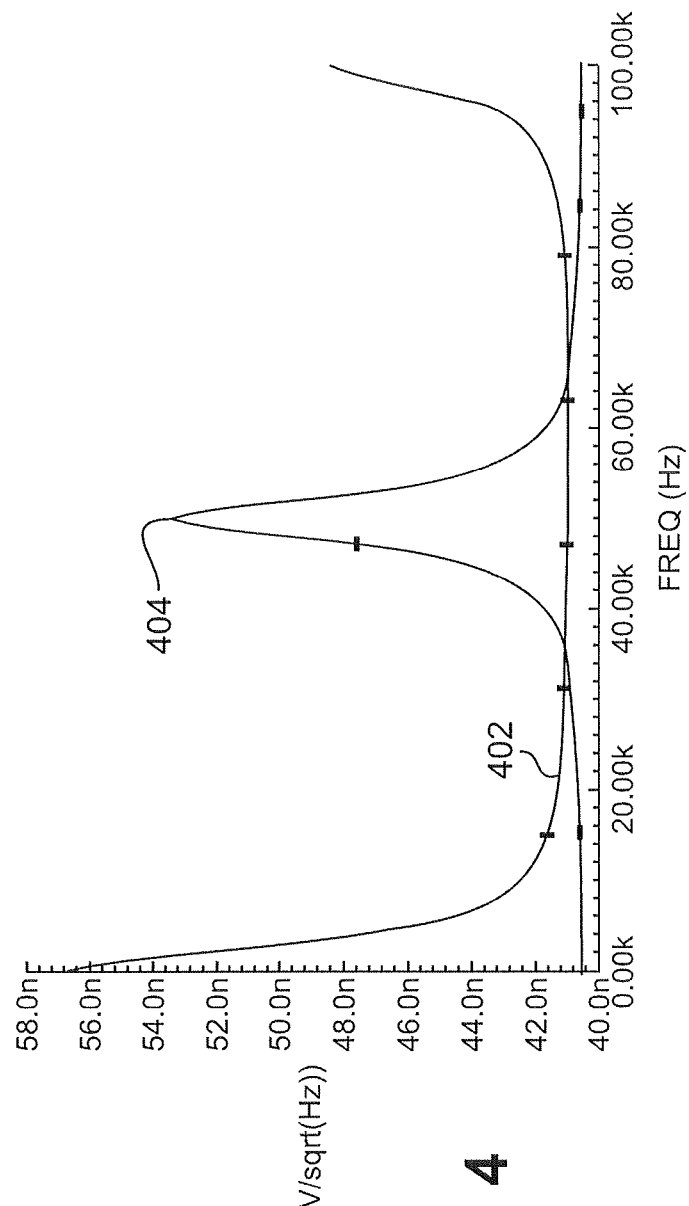
FIG. 4

CHOPPED AUTO-ZEROED PING-PONG AMPLIFIER AND RELATED APPARATUS, SYSTEM, AND METHOD

CROSS-REFERENCE TO RELATED APPLICATIONS

This application claims priority under 35 U.S.C. §119(e) to U.S. Provisional Patent Application No. 61/192,446 filed on Sep. 18, 2008 entitled "CHOPPED AUTO-ZEROED PING-PONG AMPLIFIER AND RELATED APPARATUS, SYSTEM, AND METHOD," which is hereby incorporated by reference.

This application is also related to U.S. Provisional Patent Application No. 61/192,404 filed on Sep. 18, 2008 entitled "INTEGRATED CIRCUIT WITH PIN-SELECTABLE MODE OF OPERATION AND LEVEL-SHIFT FUNCTIONALITY AND RELATED APPARATUS, SYSTEM, AND METHOD," which is hereby incorporated by reference.

TECHNICAL FIELD

This disclosure is generally directed to amplifier circuits. More specifically, this disclosure is directed to a chopped auto-zeroed ping-pong amplifier and related apparatus, system, and method.

BACKGROUND

Many different devices and systems use amplifiers for amplifying various signals. For precision applications, amplifiers with low offset, low noise, a well-defined gain, and a clean continuous output signal are often desired or required. Traditionally, amplifiers with trimmed bipolar input stages have been used, but these types of input stages typically draw bias currents from signal sources due to base currents of the bipolar transistors.

To obtain true high-impedance inputs, metal oxide semiconductor (MOS) input stages can be used, but these types of input stages are typically associated with much higher offset and 1/f noise than their bipolar counterparts. Dynamic offset cancellation (DOC) techniques can be used to mitigate these disadvantages. Two common approaches for dynamic offset cancellation are chopping and auto-zeroing. However, chopped amplifiers typically produce spurious signals at their outputs, while auto-zeroed amplifiers typically have increased low-frequency noise.

BRIEF DESCRIPTION OF THE DRAWINGS

For a more complete understanding of this disclosure and its features, reference is now made to the following description, taken in conjunction with the accompanying drawings, in which:

FIGS. 3A and 3B illustrate example input-referred noise spectra of the chopped auto-zeroed ping-pong amplifier in FIG. 1 according to this disclosure;

FIG. 4 illustrates an example simulated input-referred noise spectral density of the chopped auto-zeroed ping-pong amplifier in FIG. 1 according to this disclosure;

DETAILED DESCRIPTION

FIGS. 1 through 12, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
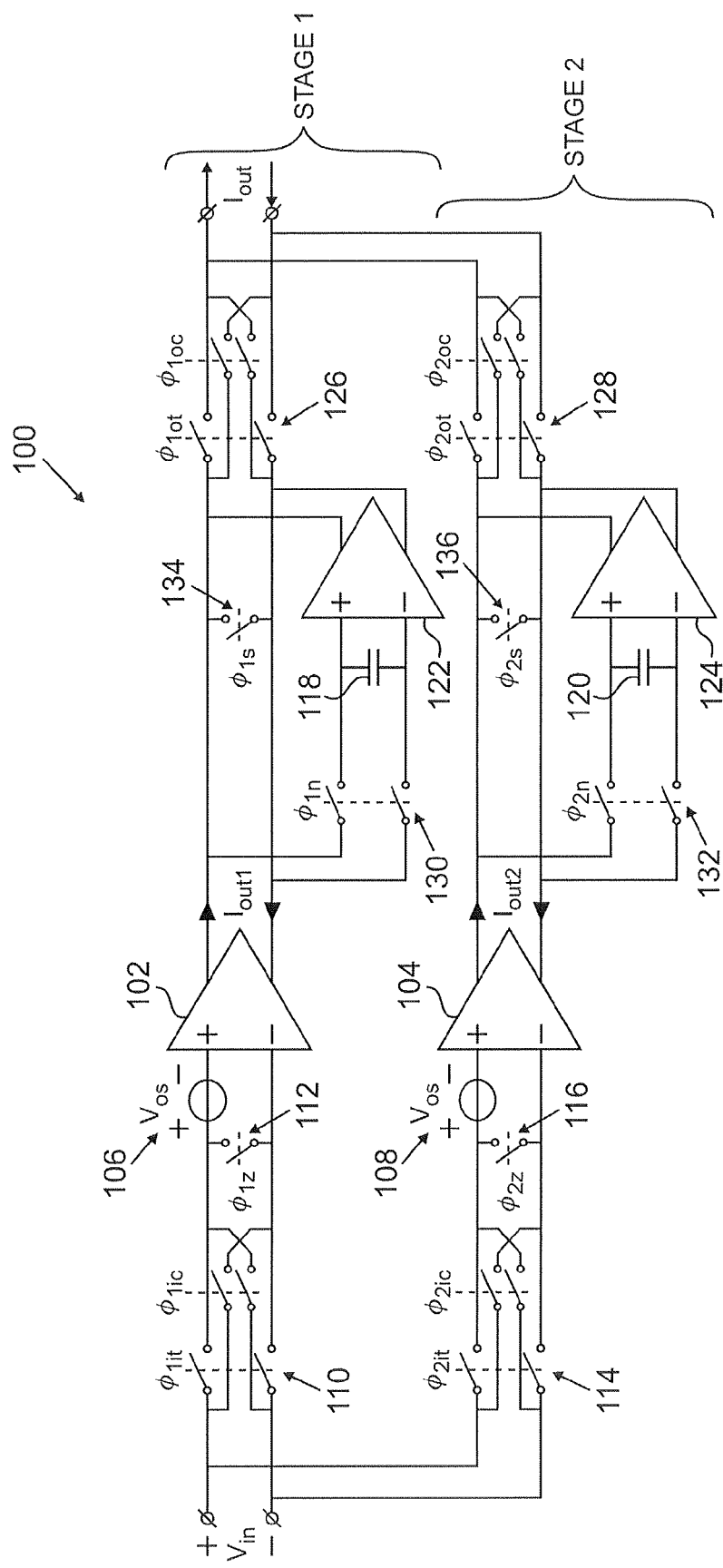
FIG. 1 illustrates a first example chopped auto-zeroed ping-pong amplifier according to this disclosure.

FIG. 1 illustrates a first example chopped auto-zeroed ping-pong amplifier 100 according to this disclosure. The embodiment of the amplifier 100 shown in FIG. 1 is for illustration only. Other embodiments of the amplifier 100 could be used without departing from the scope of this disclosure.

As shown in FIG. 1, the amplifier 100 includes two stages, each of which includes a transconductance stage 102-104, respectively. The transconductance stages 102-104 receive a differential input voltage $V_{in}$ and produce differential output currents $I_{out1}$ and $I_{out2}$, respectively. Each of the transconductance stages 102-104 includes any suitable structure for generating a differential output current using a differential input voltage, such as a transconductance amplifier.

Voltage sources 106-108 are coupled to the non-inverting inputs of the transconductance stages 102-104, respectively. The voltage sources 106-108 model the (undesired) offset voltage(s) of the transconductance stages 102-104. These voltages sources 106-108 are not deliberately designed into the amplifier 100 but are the inevitable result of fabrication imperfections.

Various switches are provided on the input side of the transconductance stages 102-104. For example, the differential input voltage $V_{in}$ is provided to the transconductance stage 102 via four polarity switches 110. These switches 110 can reverse the polarity of the differential input voltage $V_{in}$ with respect to the inputs of the transconductance stage 102. When the two outer switches 110 are closed and the two inner switches 110 are opened, the differential input voltage $V_{in}$ is provided to the transconductance stage 102 in one polarity. When the two outer switches 110 are opened and the two inner switches 110 are closed, the differential input voltage $V_{in}$ is provided to the transconductance stage 102 in the opposite polarity. Another switch 112 is coupled across the inputs of the transconductance stage 102, and the switch 112 can short the inputs to the transconductance stage 102 when closed. A similar set of four polarity switches 114 and an additional switch 116 are used with the transconductance stage 104. Each of the switches 110-116 could represent any suitable switching device, such as a metal oxide semiconductor (MOS) transistor.

Figure 2:
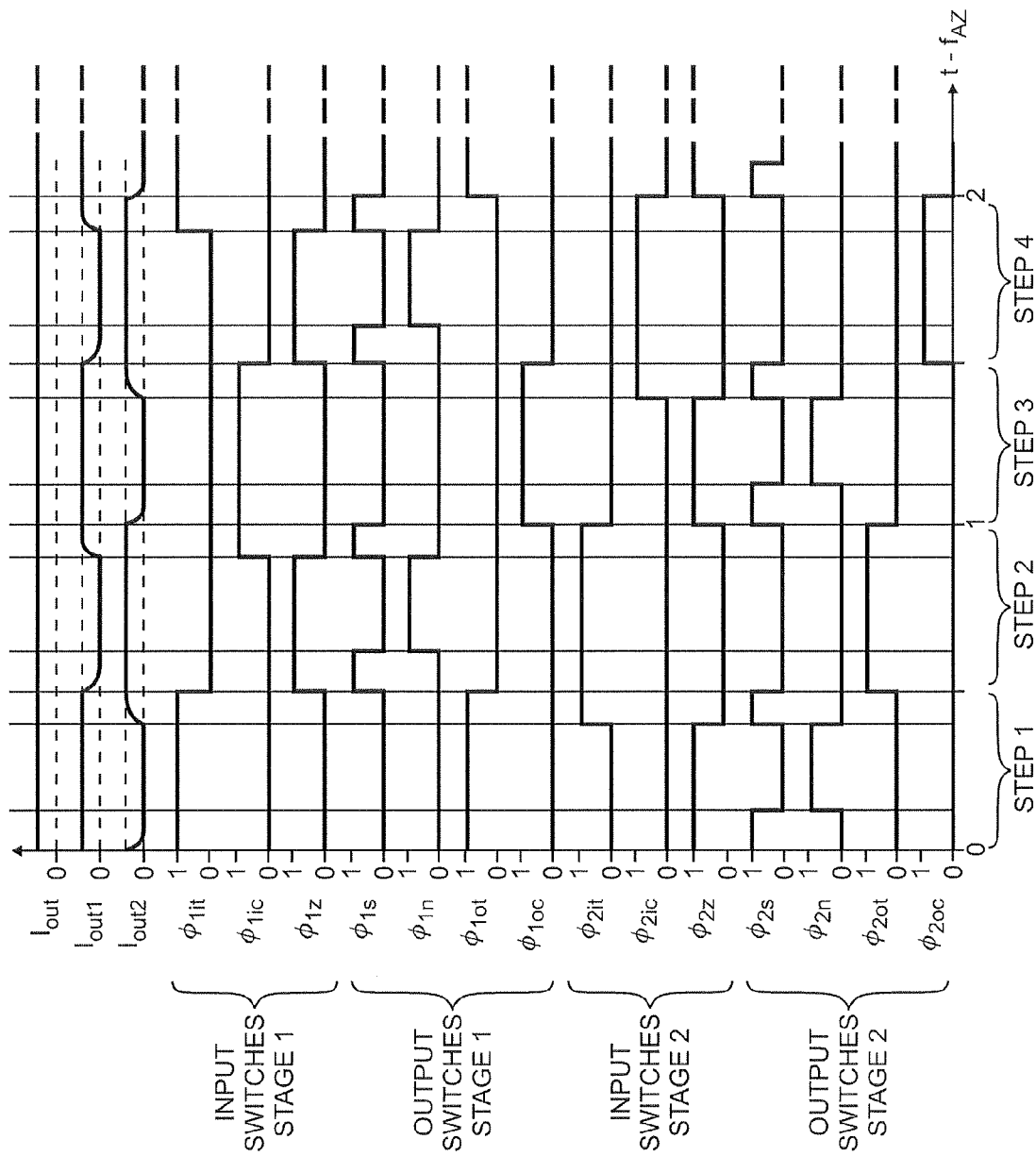
FIG. 2 illustrates an example timing diagram for the chopped auto-zeroed ping-pong amplifier in FIG. 1 according to this disclosure.

In this example, the switches 110-116 are controlled using different clock signals. The two outer switches 110 are controlled using a clock signal $\phi_{1io}$, and the two inner switches 110 are controlled using a clock signal $\phi_{1ic}$. The switch 112 is controlled using a clock signal $\phi_{1z}$. The two outer switches 114 are controlled using a clock signal $\phi_{2io}$, and the two inner switches 114 are controlled using a clock signal $\phi_{2ic}$. The switch 116 is controlled using a clock signal $\phi_{2z}$. An example of these clock signals is shown in FIG. 2.

The differential output currents from the transconductance stages 102-104 can be provided, among other things, to capacitors 118-120, respectively. The capacitors 118-120 integrate the differential output currents to produce voltages. Differential voltages across the capacitors 118-120 are provided to two additional transconductance stages 122-124, respectively. The transconductance stages 122-124 convert these voltages to differential output currents. Each of the capacitors 118-120 could have any suitable capacitance, and each of the transconductance stages 122-124 could include any suitable structure for generating a differential output current using a differential input voltage.

Various additional switches are provided on the output side of the transconductance stages 102-104. For example, a set of four polarity switches 126 can be used to reverse the polarity of the differential output current $I_{out1}$, and a set of four polarity switches 128 can be used to reverse the polarity of the differential output current $I_{out2}$. Also, a set of two switches 130 can be used to selectively provide the differential output current $I_{out1}$ to the transconductance stage 122, and a set of two switches 132 can be used to selectively provide the differential output current $I_{out2}$ to the transconductance stage 124. In addition, a switch 134 can be used to short the outputs of the transconductance stage 102, and a switch 136 can be used to short the outputs of the transconductance stage 104. Each of these switches 126-136 could represent any suitable switching device, such as a MOS transistor.

In this example, the switches 126-136 are controlled using different clock signals. The two outer switches 126 are controlled using a clock signal $\phi_{1oo}$, and the two inner switches 126 are controlled using a clock signal $\phi_{1oc}$. The two outer switches 128 are controlled using a clock signal $\phi_{2oo}$, and the two inner switches 128 are controlled using a clock signal $\phi_{2oc}$. The switches 130 are controlled using a clock signal $\phi_{1n}$, and the switches 132 are controlled using a clock signal $\phi_{2n}$. The switch 134 is controlled using a clock signal $\phi_{1s}$, and the switch 136 is controlled using a clock signal $\phi_{2s}$. An example of these clock signals is shown in FIG. 2.

In this embodiment, the amplifier 100 combines chopping, auto-zeroing, and ping-pong structures to substantially reduce or eliminate the offset voltages (modeled by voltage sources 106-108) and 1/f noise. The "ping-pong" structure is implemented using the multiple stages of the amplifier 100, where one stage is amplifying while the other stage is auto-zeroing (and vice versa). The chopping is performed by the various switches surrounding the transconductance stages 102-104 between auto-zeroing operations. The auto-zeroing is performed by the capacitors 118-120 and the additional transconductance stages 122-124.

The "ping-pong" structure allows a continuous output signal (denoted "$I_{out}$") to be generated. For example, the transconductance stage 102 could undergo auto-zeroing while the transconductance stage 104 is generating the output signal. After the transconductance stage 102 is auto-zeroed, the transconductance stage 104 could undergo auto-zeroing while the transconductance stage 102 is generating the output signal.

The "auto-zeroing" refers to periodically sampling an offset and 1/f noise and subtracting them from the output signal in each stage. This can involve two phases of operation. During an auto-zeroing phase involving the transconductance stage 102, the inputs to the transconductance stage 102 are shorted by the switch 112, and the differential output current of the transconductance stage 102 is blocked by opening all of the switches 126. Also, the switches 130 are closed to couple the transconductance stage 102 to the capacitor 118 and the transconductance stage 122. Since the switch 112 is closed, the differential output current from the transconductance stage 102 represents the offset of the transconductance stage 102. This offset current is integrated by the capacitor 118, and the transconductance stage 122 (driven by the voltage across the capacitor 118) provides a current that nulls the offset current from the transconductance stage 102. During an amplification phase involving the transconductance stage 102, the transconductance stage 102 is connected to the input (the switch 112 is opened and two of the switches 110 are closed) and the output (the switch 134 is opened and two of the switches 126 are closed) of the amplifier 100. The voltage across the capacitor 118 is held during the amplification phase, so the transconductance stage 122 continues to compensate for the offset current from the transconductance stage 102. The same procedure may occur using the transconductance stages 104 and 124 (and their associated switches).

In some embodiments, the bandwidth of the nulling or auto-zeroing loop (denoted $f_{nul}$, f is designed to be well below $f_{AZ}/2$ (where $f_{AZ}$ denotes the auto-zeroing frequency). The nulling or auto-zeroing loop includes a capacitor 118-120 and a transconductance stage 122-124. This bandwidth can help to prevent under-sampling of white noise, resulting in a noise floor around DC that is only $\sqrt{2}$ times the white noise level of the transconductance stages 102-104 as shown in FIG. 3A. An additional effect of the smaller nulling bandwidth is that the settling of the auto-zeroing loop may require multiple clock periods, which is not an issue if $f_{nul}$ is above the 1/f noise corner frequency so that the loop is fast enough to cancel the offset and the 1/f noise.

Also, in some embodiments, the chopping performed in the amplifier 100 is performed at half the auto-zeroing frequency $f_{AZ}$. To realize this, each stage of the amplifier 100 includes two sets of polarity switches (at both the input and the output of each transconductance stage 102-104). These polarity switches operate to reverse the polarity of the transconductance stages 102-104 between successive auto-zeroing phases. This leads to the following repeating operational sequence during four consecutive auto-zeroing phases (which are shown in FIG. 2):

the transconductance stage 102 is straight-connected and provides the output signal $I_{out}$, while the transconductance stage 104 is auto-zeroed (step 1);

the transconductance stage 104 is straight-connected and provides the output signal $I_{out}$, while the transconductance stage 102 is auto-zeroed (step 2);

the transconductance stage 102 is cross-connected and provides the output signal $I_{out}$, while the transconductance stage 104 is auto-zeroed (step 3); and the transconductance stage 104 is cross-connected and provides the output signal $I_{out}$, while the transconductance stage 102 is auto-zeroed (step 4).

Because of this "slow" chopping at a frequency of $f_{AZ}/2$, the noise at that frequency is translated to DC. However, the small nulling bandwidth allows the noise around $f_{AZ}/2$ to equal the white noise level. The input-referred noise around DC can therefore equal the white noise level, while the $\sqrt{2}$ times larger noise is modulated away from DC (which is shown in FIG. 3B).

In addition, spikes caused by the finite bandwidth of the transconductance stages 102-104 can be reduced or prevented in the output signal $I_{out}$ using the switches 134-136. Prior to closing various ones of the polarity switches 126-128 during the amplification phase, a settling phase may occur where the switches 134-136 are closed. This dumps the output current of the transconductance stages 102-104. As a result, transients that might otherwise cause spikes in the output of the amplifier 100 can be dissipated. When the output current of each transconductance stage 102-104 has settled to its final value, the transconductance stage can be coupled to the output of the amplifier 100 by its corresponding switches 126-128. Provided the settling phases are sufficiently long compared to the settling time of the transconductance stages 102-104, the transients that remain at the output of the amplifier 100 can be negligible.

A similar settling phase can be used before each auto-zeroing phase (before the switch 130 or 132 is closed). This may be useful since the auto-zeroing loop, given its small bandwidth, may need some time to settle, and the transients associated with the transition from amplification to auto-zeroing could disturb the auto-zeroing process. The settling phases can therefore provide a transient-free output and, at the same time, enable the slow settling of the auto-zeroing loop.

FIG. 4 illustrates an input-referred noise spectral density of the chopped auto-zeroed ping-pong amplifier 100 in FIG. 1. In FIG. 4, line 402 represents the output associated with receiving white input-referred noise of 40 nV/sqrt(Hz). An auto-zeroing frequency $f_{AZ}$ of 100 kHz and a nulling loop bandwidth of 1.5 kHz are used, but chopping is not performed. As can be seen, without chopping, $\sqrt{2}$ times higher noise is located around DC. Line 404 represents the output associated with a chopped auto-zeroed ping-pong amplifier 100 that performs chopping at $f_{AZ}/2$, which modulates the increased noise away from DC and results in a noise floor around DC that equals the white noise of the transconductance stages 102-104.

In this way, chopping and auto-zeroing are combined in a ping-pong amplifier to obtain low offset, low noise, and a clean continuous output. The amplifier 100 also has a well-defined gain when applied in current-feedback instrumentation amplifiers or other devices or systems. In addition, the amplifier 100 can provide high input impedance, which may be required to read out high-impedance signal sources and to avoid drawing input current from the signal sources.

Although FIGS. 1 through 4 illustrate a first example chopped auto-zeroed ping-pong amplifier 100 and operational details thereof, various changes may be made to FIGS. 1 through 4. For example, the chopped auto-zeroed ping-pong structure has been described as being used in a transconductance stage (which could form the offset-determining input stage of a multi-stage amplifier). However, the chopped auto-zeroed ping-pong structure could be used with any other suitable amplifier stages, such as in voltage amplifiers with fixed gain.

As another example, FIG. 1 has illustrated an amplifier having two parallel stages. However, this architecture could be extended to an amplifier having any arbitrary number of stages. In some embodiments, one stage could be auto-zeroed at any point in time, while the overall output signal $I_{out}$ represents the sum of the outputs of the remaining stages. One advantage of such a multi-stage implementation is that the overall supply current needed to obtain a given noise performance can be less than that of a two-stage chopped auto-zeroed ping-pong amplifier. In the latter case, the overall input-referred noise around DC can equal the white noise level of one of the input stages. In an implementation with n parallel stages, the overall input-referred noise could be a factor of $\sqrt{n-1}$ lower. Conversely, to obtain a given overall input-referred noise, the power consumption of an n-stage implementation can be a factor $2(n-1)/n$ lower than that of the two-stage implementation. In a three-stage implementation, for instance, this could provide a 25% reduction in power consumption. Of course, this advantage may come at the expense of increased complexity and die area.

Figure 5:
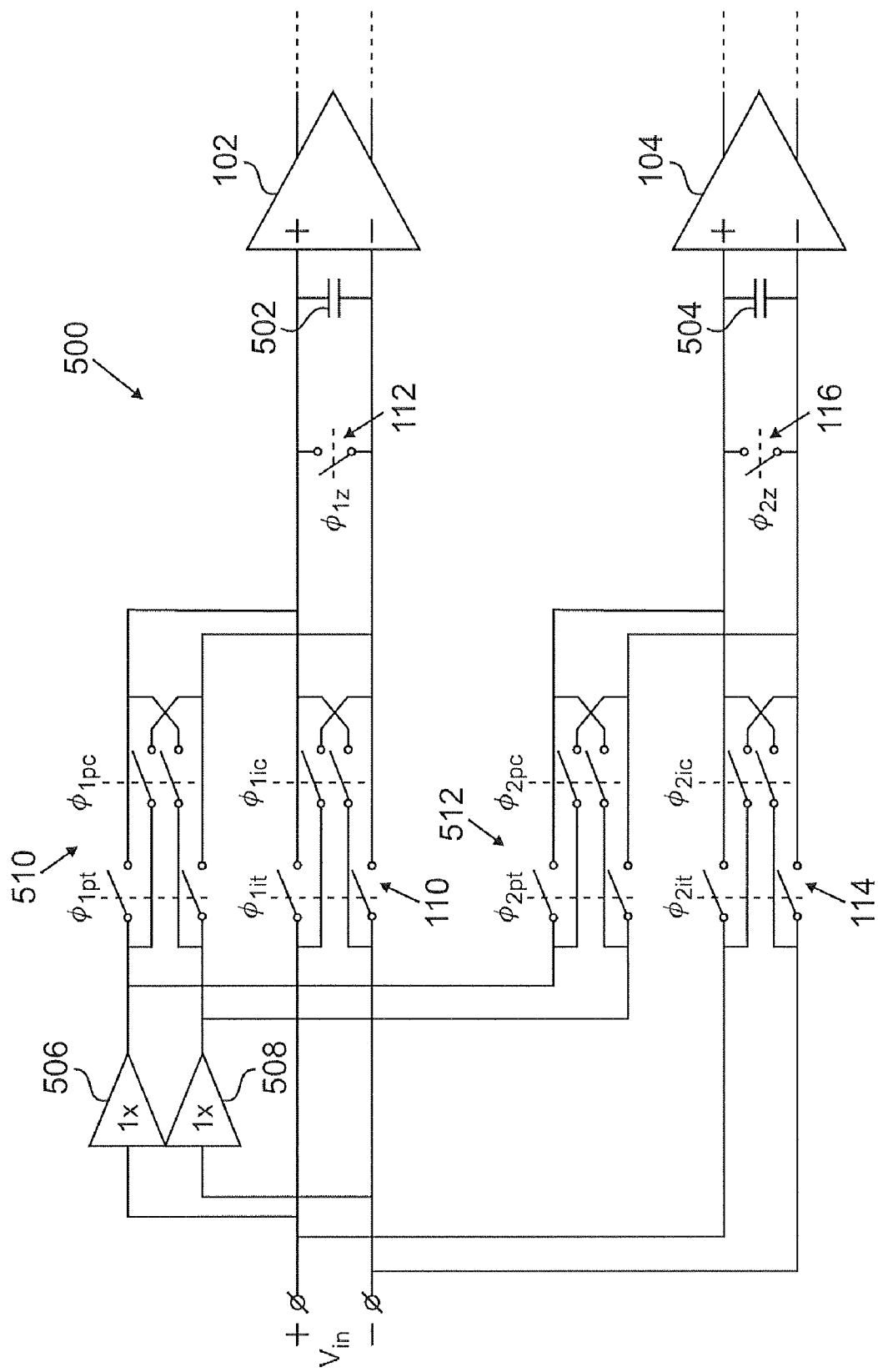
FIG. 5 illustrates an example pre-charging extension for the chopped auto-zeroed ping-pong amplifier in FIG. 1 according to this disclosure.

FIG. 5 illustrates an example pre-charging extension 500 for the chopped auto-zeroed ping-pong amplifier 100 in FIG. 1 according to this disclosure. The pre-charging extension 500 shown in FIG. 5 is for illustration only. Other embodiments of the pre-charging extension 500 could be used without departing from the scope of this disclosure.

In FIG. 5, the pre-charging extension 500 is used to pre-charge two input capacitors 502-504 that are coupled across the inputs of the transconductance stages 102-104, respectively. These capacitors 502-504 may not be deliberately included in the design but may instead model the undesired and inevitable input capacitances typically associated with transconductance stages implemented using MOS transistors. The capacitors 502-504 can be pre-charged during a pre-charging phase, which may occur between the auto-zeroing phase and the amplification phase. During this pre-charging phase, two unity-gain buffer amplifiers 506-508 can charge the input capacitors 502-504 to approximately $V_{in}$. As a result, during the following amplification phase, the signal source providing the input signal $V_{in}$ may only need to provide a small amount of charge to correct for any errors introduced by the buffer amplifiers 506-508. In this way, the input of each transconductance stage 102-104 can be provided with a buffered version of the input voltage $V_{in}$ before that transconductance stage is actually connected to the input voltage $V_{in}$. This can help to significantly decrease the current drawn from the signal source and increase the input impedance of the amplifier 100.

In some embodiments, the pre-charging phases could form part of the settling phases used to allow the outputs from the transconductance stages 102-104 to settle. The settling phases could therefore include (i) a pre-charging portion when the input of a transconductance stage 102-104 is driven by the pre-charge amplifier 506-508 and settles roughly to its final value and (ii) a remaining portion when the input of the transconductance stage 102-104 is driven directly by the signal source and settles accurately to its final value.

Two sets of polarity switches 510-512 can be used to change the polarity of the charges stored on the input capacitors 502-504. As noted above, the sets of polarity switches 110 and 114 can reverse the polarity of the differential input signal provided to the transconductance stages 102-104. Because of this, the polarities of the charges on the capacitors 502-504 can also be reversed to provide the proper charges to the transconductance stages 102-104.

In this example, the switches 510-512 are controlled using different clock signals. The two outer switches 510 are controlled using a clock signal $\phi_{1pt}$, and the two inner switches 510 are controlled using a clock signal $\phi_{1pc}$. The two outer switches 512 are controlled using a clock signal $\phi_{2pt}$, and the two inner switches 512 are controlled using a clock signal $\phi_{2pc}$. An example of these clock signals is shown in FIG. 6.

Figure 6:
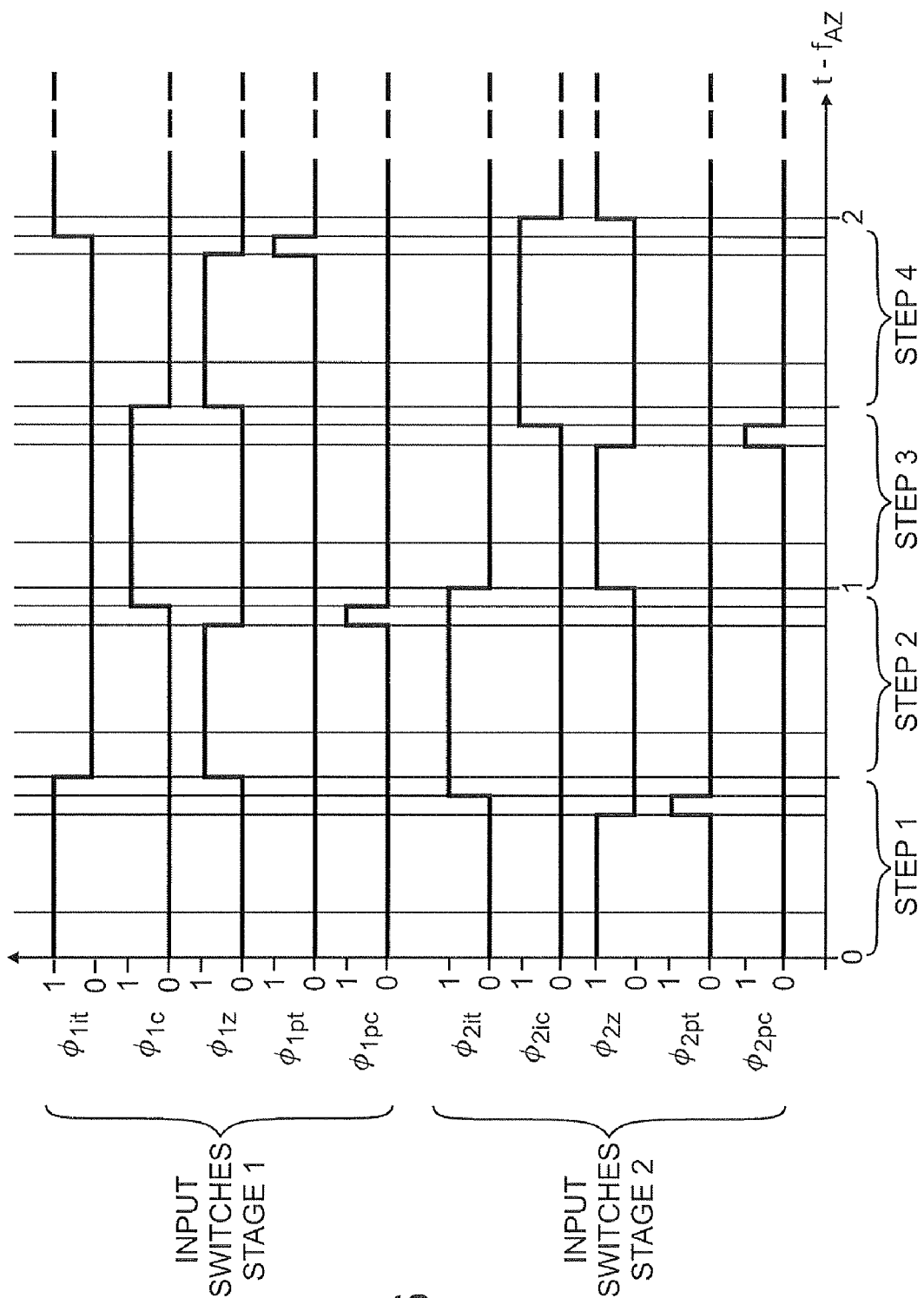
FIG. 6 illustrates an example timing diagram for the chopped auto-zeroed ping-pong amplifier in FIG. 5 according to this disclosure.

Although FIGS. 5 and 6 illustrate an example pre-charging extension 500 to the chopped auto-zeroed ping-pong amplifier 100 and operational details thereof, various changes may be made to FIGS. 5 and 6. For example, any other suitable structure could be used to pre-charge the input capacitors.

Figure 7:
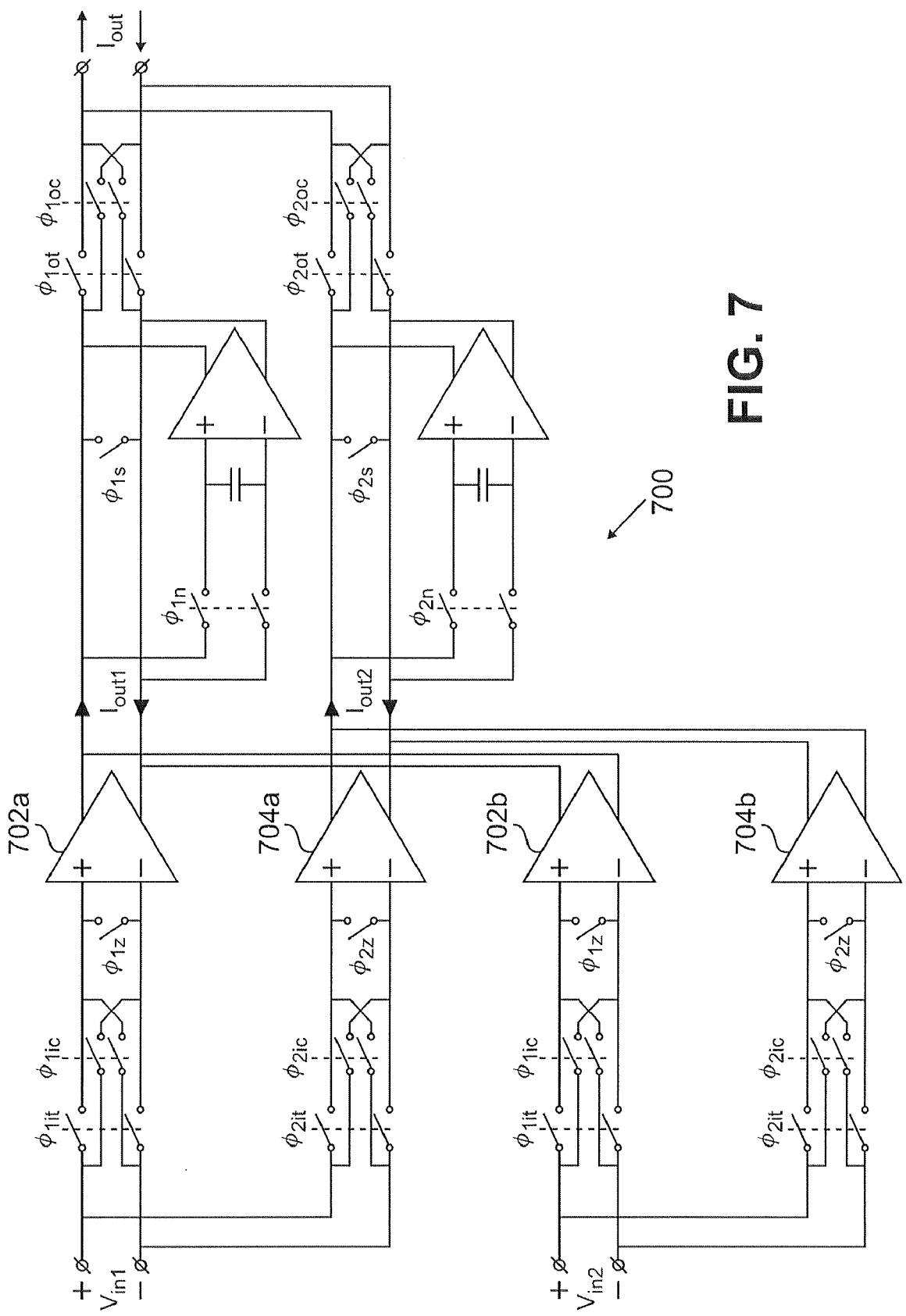
FIG. 7 illustrates a second example chopped auto-zeroed ping-pong amplifier according to this disclosure.

FIG. 7 illustrates a second example chopped auto-zeroed ping-pong amplifier 700 according to this disclosure. The embodiment of the amplifier 700 shown in FIG. 7 is for illustration only. Other embodiments of the amplifier 700 could be used without departing from the scope of this disclosure.

As described above, the chopped auto-zeroed ping-pong amplifier 100 receives a single input voltage $V_{in}$. The concept behind the amplifier 100 of FIG. 1 can be generalized to amplifiers with more than one input voltage, such as a differential difference amplifier (DDA). A differential difference amplifier is similar to an operational amplifier but has two inputs and one output (where the output is a function of the difference between the inputs). One example embodiment of the input stage of a DDA is shown in FIG. 7.

The chopped auto-zeroed ping-pong amplifier 700 shown in FIG. 7 contains many of the same components shown in FIG. 1, including transconductance stages 702a and 704a and their associated input switches. These components are used with a first input voltage $V_{in1}$. The amplifier 700 duplicates these components and includes transconductance stages 702b and 704b and their associated input switches, which are used with a second input voltage $V_{in2}$. The transconductance stages 702a and 702b collectively play the same role as the transconductance stage 102 in FIG. 1, and the transconductance stages 704a and 704b collectively play the same role as the transconductance stage 104 in FIG. 1. The timing diagram from FIG. 2 could remain the same when used with the amplifier 700.

Figure 8:
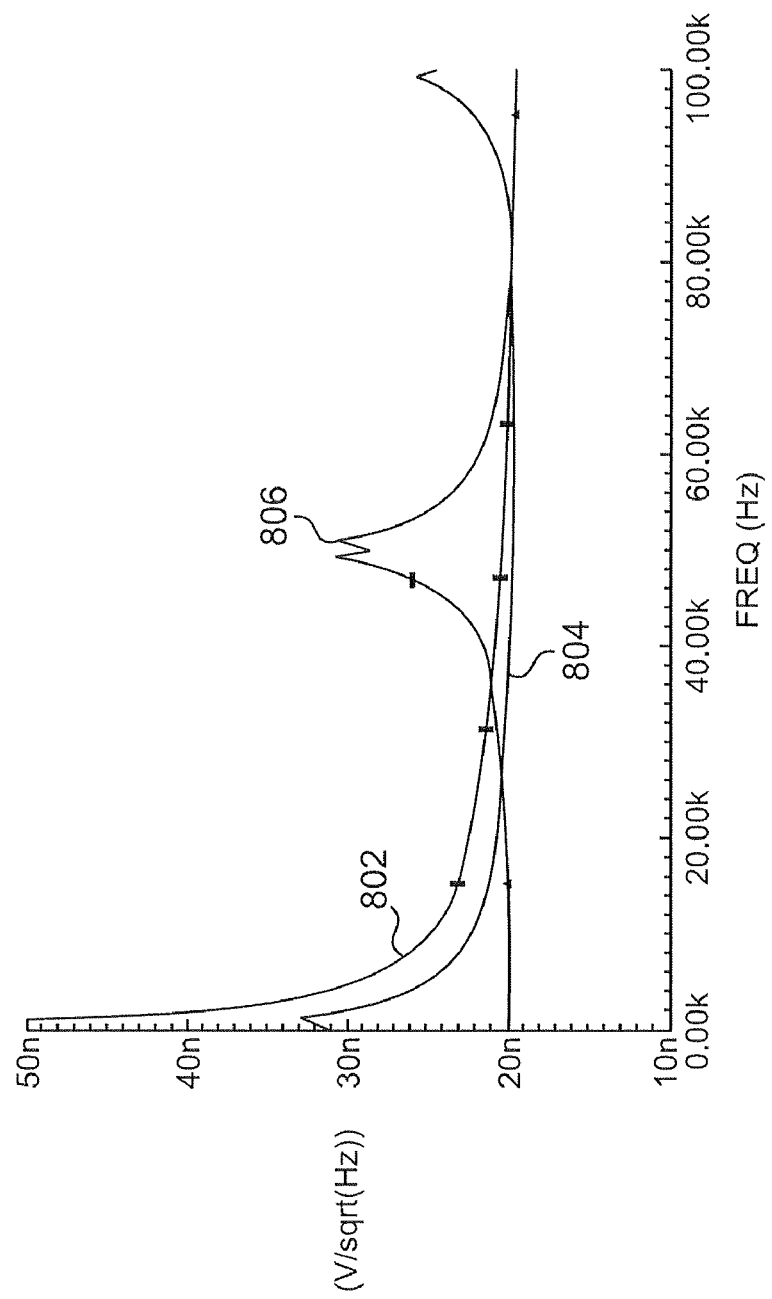
FIG. 8 illustrates an example simulated input-referred noise spectral density of the chopped auto-zeroed ping-pong amplifier in FIG. 7 according to this disclosure.

FIG. 8 illustrates an input-referred noise spectral density of the chopped auto-zeroed ping-pong amplifier 700 in FIG. 7. In FIG. 8, lines 802 and 804 represent the outputs associated with white input-referred noise signals of 20 nV/sqrt(Hz) each. An auto-zeroing frequency $f_{AZ}$ of 100 kHz and a nulling loop bandwidth of 1.5 kHz are used, but chopping is not performed. As can be seen, without chopping, $\sqrt{2}$ times higher noise is located around DC for each of these two noise signals. Line 806 represents the output associated with a chopped auto-zeroed ping-pong amplifier 700 that performs chopping at 50 kHz, which modulates the increased noise away from DC and results in a noise level around DC of approximately 20 nV/sqrt(Hz).

Although FIGS. 7 and 8 illustrate a second example chopped auto-zeroed ping-pong amplifier 700 and operational details thereof, various changes may be made to FIGS. 7 and 8. For example, the chopped auto-zeroed ping-pong structure has been described as being used in a transconductance stage, although the chopped auto-zeroed ping-pong structure could be used with any other suitable amplifier stages. Also, this architecture could be extended to an amplifier having any arbitrary number of stages and any arbitrary number of input voltages.

Figure 9:
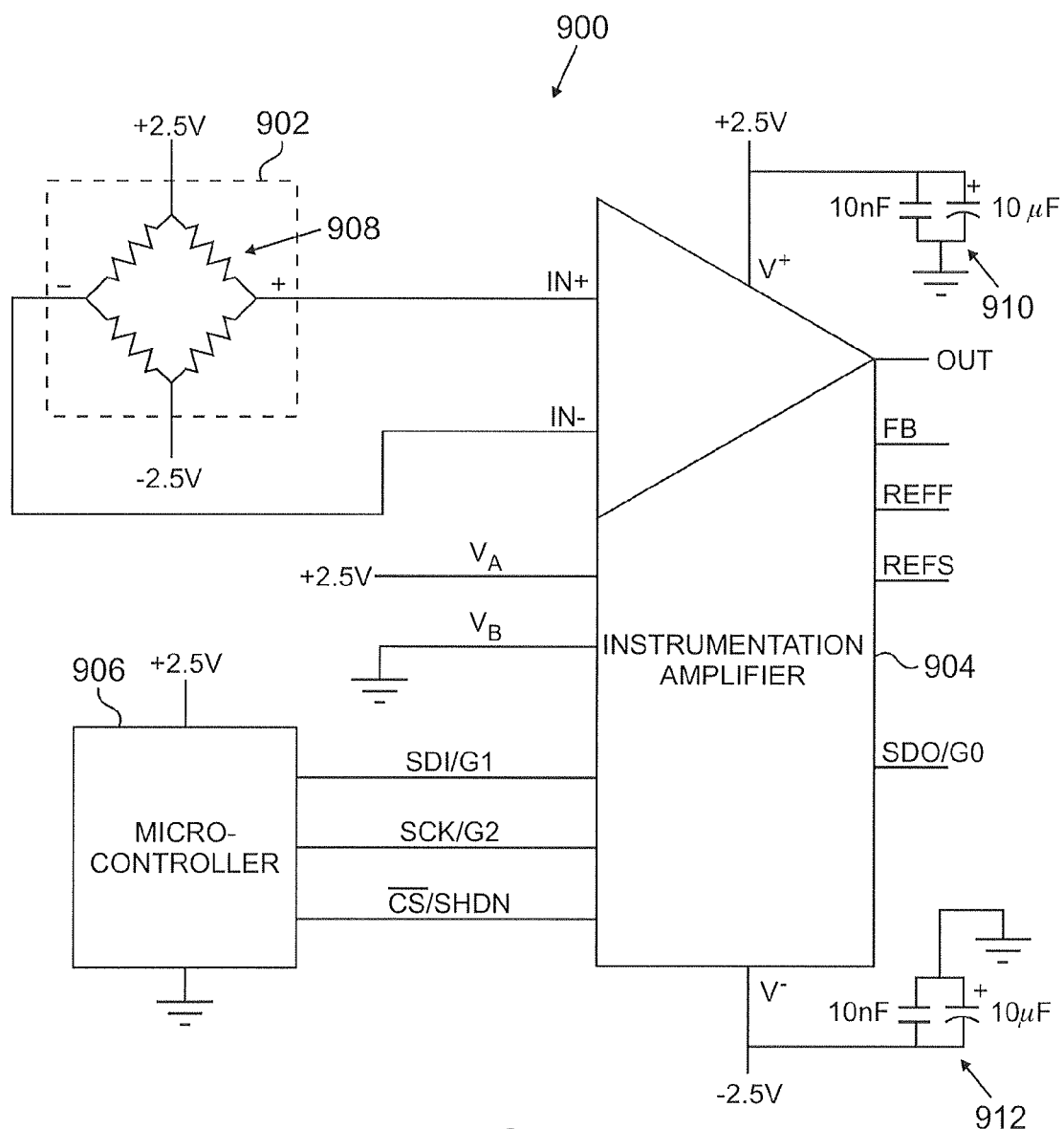
FIG. 9 illustrates a first example system having a chopped auto-zeroed ping-pong amplifier according to this disclosure.

FIG. 9 illustrates an example system 900 having a chopped auto-zeroed ping-pong amplifier according to this disclosure. The embodiment of the system 900 shown in FIG. 9 is for illustration only. Other embodiments of the system 900 could be used without departing from the scope of this disclosure.

As shown in FIG. 9, the system 900 includes a sensor 902, an instrumentation amplifier 904, and a microcontroller 906. The sensor 902 generally represents any suitable structure for detecting or measuring one or more conditions. In this embodiment, the sensor 902 includes a resistive bridge 908, which is coupled to two supply voltages (+2.5V and −2.5V in this example). The resistive bridge 908 can function as a pressure sensor. Note, however, that any other suitable sensing structure could be used as the sensor 902, such as a bridge sensor, thermopile, or thermocouple.

The instrumentation amplifier 904 receives differential input signals (denoted IN+ and IN−) and amplifies a differential voltage while substantially rejecting common mode voltage in the input signals. The instrumentation amplifier 904 receives supply voltages $V^+$ and $V^-$, which represent the analog supply voltages for the instrumentation amplifier 904. Capacitors 910-912 are coupled to the supply voltages. In particular embodiments, the instrumentation amplifier 904 is capable of sensing differential input voltages in a common-mode range that extends from 100 mV below the negative supply voltage to 1.25V or 1.4V below the positive supply voltage. Also, in particular embodiments, a differential-mode input voltage range may be limited to ±250 mV. Even at a maximum supply (such as 5V) and the lowest gain (such as 10×), the output can still swing rail-to-rail (assuming it is referenced to 2.5V).

Two force-sense reference pins (REFF and REFS) can be used to receive one or more reference voltages. In some embodiments, a resistor can be coupled to each force-sense reference pin. The non-inverting input of an operational amplifier can be coupled to a reference voltage. The output of the operational amplifier can be coupled to the resistor coupled to the REFF pin, and the inverting input of the operational amplifier can be coupled to the resistor coupled to the REFS pin. This can be used to provide a high-Z reference input while eliminating errors due to connection resistances.

In this example embodiment, two input voltages $V_A$ and $V_B$ can be received and used by the instrumentation amplifier 904 (although the amplifier 904 could operate without receiving the voltages $V_A$ and $V_B$). The input voltages $V_A$ and $V_B$ can be used to define the logic-high and logic-low values used by the instrumentation amplifier 904. The instrumentation amplifier 904 can also determine the amplifier's mode of operation based on the input voltages $V_A$ and $V_B$. For example, if the $V_A$ voltage exceeds the $V_B$ voltage, the instrumentation amplifier 904 operates in "parallel mode." In parallel mode, the gain of the instrumentation amplifier 904 can be selected by applying certain logic levels to three digital input pins (G0-G2), and the instrumentation amplifier 904 can be switched into a power-saving shutdown mode by applying a logic high level to a shutdown pin (SHDN). In this example, since three pins are used for gain programming, up to eight gains could be supported (including a user-defined gain). The user-defined gain of the instrumentation amplifier 904 could be set to an arbitrary value (such as a value larger than 10) using two external resistors coupled to the FB pin, where the gain can be defined as G=(R1+R2)/R2. In these embodiments, the gain settings defined by the G0-G2 pins could be as follows: 000=10, 100=20, 010=50, 110=100, 001=200, 101=500, 011=1000, and 111=user defined. The accuracy of the pre-defined gain settings could be ±0.1%.

If the $V_B$ voltage exceeds the $V_A$ voltage, the instrumentation amplifier 904 operates in a "serial mode." In the serial mode, the four digital pins operate as a serial peripheral interface, which includes a clock input (SCK), a data input (SDI), a chip select input (CS), and a data output (SDO). In particular embodiments, the instrumentation amplifier 904 can support double-buffered control registers for glitch-free transitions between settings, and multiple instrumentation amplifiers 904 could be cascaded (daisy-chained) by connecting the SDO pin of one amplifier 904 to the SDI pin of the next amplifier 904 and tying the CS pins together.

During production testing or at other times, the $V_A$ and $V_B$ voltages can be set equal to or near the positive analog supply $V^+$ during power-up, putting the instrumentation amplifier 904 into a "test mode." In the test mode, after power-up, the voltages $V_A$ and $V_B$ can behave the same when regular serial mode is used, but an extended SPI interface may be made available (through which a number of test registers could be accessed, in addition to the normal customer-accessible functionality).

The instrumentation amplifier 904 represents any suitable structure for amplifying differential input signals while substantially rejecting common-mode voltage, such as an instrumentation amplifier having a rail-to-rail output, low input voltage noise, and high gain-bandwidth.

The microcontroller 906 is coupled to the serial interface implemented by the configurable pins of the instrumentation amplifier 904 in this example. The microcontroller 906 can receive amplified sensor readings from the instrumentation amplifier 904 and use the amplified sensor readings in any suitable manner. The microcontroller 906 includes any suitable structure for analyzing or otherwise using data provided by the instrumentation amplifier 904.

Figure 10:
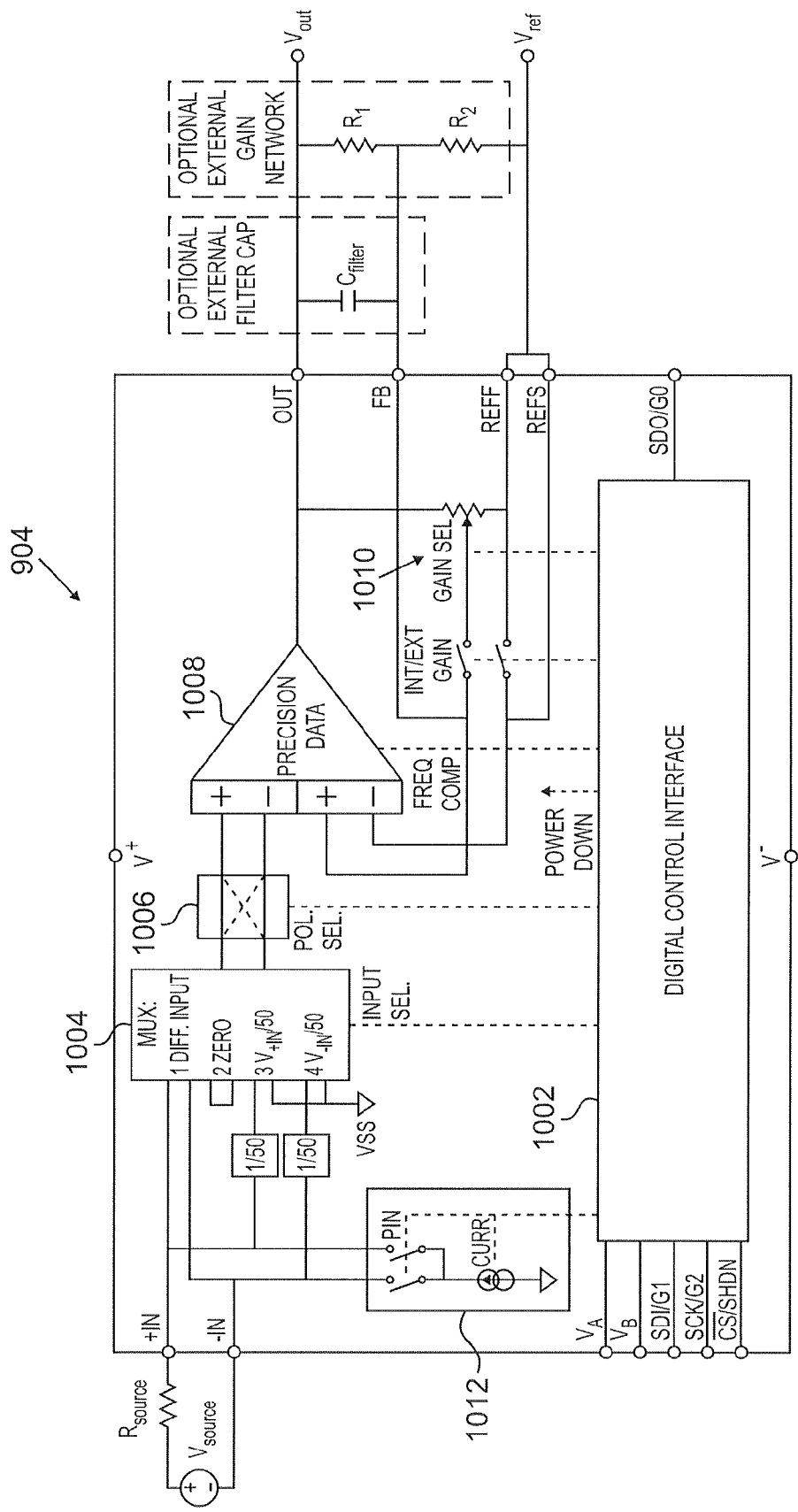
FIG. 10 illustrates an example instrumentation amplifier having a chopped auto-zeroed ping-pong amplifier according to this disclosure.

FIG. 10 illustrates an example instrumentation amplifier 904 having a chopped auto-zeroed ping-pong amplifier according to this disclosure. The embodiment of the instrumentation amplifier 904 shown in FIG. 10 is for illustration only. Other embodiments of the instrumentation amplifier 904 could be used without departing from the scope of this disclosure.

As shown in FIG. 10, a control interface 1002 is coupled to two input voltage pins for receiving the $V_A$ and $V_B$ input voltages. The control interface 1002 is also coupled to the four reconfigurable interface pins that can operate as a serial or parallel interface. The control interface 1002 can use the input voltages and various logic and other signals to generate control signals for other components of the instrumentation amplifier 904. It may be noted, however, that the control interface 1002 could operate using one or no input voltages, and the control interface 1002 need not be capable of identifying its mode of operation based on the input voltages $V_A$ and $V_B$.

A multiplexer 1004 receives various differential inputs and selects one of the differential inputs for output. In this example, the differential inputs include the differential input signals IN+/IN−, along with divided versions of the input signals IN+ and IN− (with $V^-$ as the other signal in those differential pairs). The multiplexer 1004 can select one of the inputs to output based on control signals (INPUT SEL.) from the control interface 1002. The multiplexer 1004 can also be used to short the inputs and to measure the voltage at the +IN and −IN pins with respect to VSS. The scale factor (1/50×) provides a programmable overall gain of 0.2×, 0.4×, 1×, 2×, 4×, 10×, and 20×.

A polarity switch 1006 is coupled between the multiplexer 1004 and a differential amplifier 1008. The polarity switch 1006 can pass the differential outputs from the multiplexer 1004 to the differential amplifier 1008. The polarity switch 1006 can also selectively reverse the polarity of the differential outputs based on a control signal (POL. SEL.) from the control interface 1002. Note that the shorting and polarity reversal can be useful for system-level calibration and for "rectifying" differential input signals. Also, measuring $V_{+IN}$ and $V_{-IN}$ with respect to VSS can be used in conjunction with a fault detection current source to detect floating or shorted inputs and for monitoring the input common-mode voltage.

The differential amplifier 1008 amplifies a difference between the differential signals provided to the amplifier 1008 from the polarity selector 1006 and from gain circuitry 1010. The differential amplifier 1008 also provides an output signal (denoted "Out"). The differential amplifier 1008 here performs frequency compensation, which can be adjusted to increase the bandwidth for higher gain settings. The differential amplifier 1008 may operate based on frequency compensation settings (FREQ. COMP.) from the control interface 1002. For example, Table 1 illustrates example gains and frequency compensations when the instrumentation amplifier 904 is operating in serial mode.

TABLE 1

| GAIN | BANDWIDTH | | | |
|---|---|---|---|---|
| | COMP = 00 (default) | COMP = 01 | COMP = 10 | COMP = 11 |
| 10× | 800 kHz | n/a | n/a | n/a |
| 20× | 400 kHz | n/a | n/a | n/a |
| 50× | 160 kHz | 480 kHz | n/a | n/a |
| 100× | 80 kHz | 240 kHz | 800 kHz | n/a |
| 200× | 40 kHz | 120 kHz | 400 kHz | n/a |
| 500× | 16 kHz | 48 kHz | 160 kHz | 480 kHz |
| 1000× | 8 kHz | 24 kHz | 80 kHz | 240 kHz |
| User-defined gain GBW product | >10× 8 MHz | >30× 24 MHz | >100× 80 MHz | >300× 240 MHz |

Table 2 illustrates example gains and frequency compensations when the instrumentation amplifier 904 is operating in parallel mode. Here, the frequency compensation can be automatically linked to the gain setting to optimize bandwidth.

TABLE 2

| G0 | G1 | G2 | GAIN | COMP | BANDWIDTH |
|---|---|---|---|---|---|
| 0 | 0 | 0 | 10× | 00 | 800 kHz |
| 1 | 0 | 0 | 20× | 00 | 400 kHz |
| 0 | 1 | 0 | 50× | 01 | 480 kHz |
| 1 | 1 | 0 | 100× | 10 | 800 kHz |
| 0 | 0 | 1 | 200× | 10 | 400 kHz |
| 1 | 0 | 1 | 500× | 11 | 480 kHz |
| 0 | 1 | 1 | 1000× | 11 | 240 kHz |

In the user-defined gain mode (G0=G1=G2=1), COMP=00 so that the instrumentation amplifier 904 is stable for gains greater than 10× with a GBW product of 8 MHz. The differential amplifier 1008 could, for example, represent a differential difference amplifier, which could include the amplifier 700 shown in FIG. 7.

The gain circuitry 1010 controls the gain provided in the instrumentation amplifier 904. The gain could be based on resistors coupled to the gain circuitry 1010 or based on control signals (INT./EXT. GAIN and GAIN SEL.) from the control interface 1002.

In addition, fault detection circuitry 1012 could be used to detect open and shorted inputs, as well as degrading connections to signal sources. The fault detection circuitry 1012 could operate based on a pin selection signal (PIN) and current signals (CURR.) from the control interface 1002. The pin selection signal controls whether a current source in the fault detection circuitry 1012 is coupled to the +IN pin or the −IN pin. The current signals control the amount of current provided, such as when 000=disconnected and powered down, 100=10 nA, 010=100 nA, 110=1 µA, 001=10 µA, 101=100 µA, and 011 and 111=disconnected but powered on (which may allow faster switching on and off, particularly for currents less than 1 µA). Using a combination of the multiplexer 1004 and the current source in the fault detection circuitry 1012, the following fault conditions can be detected:

open input: inject test current and measure voltage at input pin, where the pin is pulled to VDD when open;

input shorted to VDD or VSS: measure voltage at input pin, where if shorted it will not be at the expected common-mode level;

inputs shorted together: measure differential input voltage change $\Delta V_{in}$ when test current is injected at either input pin, where no significant $\Delta V_{in}$ is measured if inputs are shorted; and degraded connection to signal source: measure differential input voltage change $\Delta V_{in}$ when test current is injected at either input pin, where total source resistance (sum of sensor and wiring resistance) is $R_{source} = \Delta V_{in}/I_{test}$ (this can be compared to an expected value or monitored over time).

The control interface 1002 further supports a low-power or power-down mode. For example, if SHDN=1, the instrumentation amplifier 904 can enter a power-down mode in which the supply current is reduced to less than 1 µA. This mode could allow, for example, the outputs of multiple instrumentation amplifiers 904 to be coupled or multiplexed to a single device, such as to a single analog-to-digital converter (ADC) input. When powered-down, the output pin of the instrumentation amplifier 904 could have a high impedance, so that the outputs of multiple instrumentation amplifiers 904 can be tied together (provided only one instrumentation amplifier 904 is powered on at a given time during normal operation). In some embodiments, the power-down mode may not be the default mode at startup, so resistors could be added in series with the output pins of multiple instrumentation amplifiers 904 to limit the output currents that flow during the brief time after power-up when the instrumentation amplifiers 904 are powered simultaneously.

The instrumentation amplifier 904 could support any other suitable features. For example, an external filter capacitor could be connected between the OUT and FB pins to implement a low-pass filter, where the corner frequency can be defined as $f_{-3dB} = 1/(2\pi \cdot R_{filter} \cdot C_{filter})$. Note that the $R_{filter}$ value could be slightly gain dependent, such as 10%.

In particular embodiments, all outputs from the control interface 1002 could be set to zero on power-up unless a fuse associated with a pin is blown (and defaults of bits without fuses can be metal-mask programmable).

Although FIGS. 9 and 10 illustrate an example system 900 having a chopped auto-zeroed ping-pong amplifier (and components thereof), various changes may be made to FIGS. 9 and 10. For example, while example components are shown in these figures, other components performing the same or similar functions could be used. Also, these figures illustrate one example use of a chopped auto-zeroed ping-pong amplifier. A chopped auto-zeroed ping-pong amplifier could be used in a wide variety of other devices or systems, such as any analog amplifier (like other instrumentation amplifiers, operational amplifiers, and amplifiers in general). Other example uses of an amplifier are provided in U.S. patent application Ser. No. 11/804,490 and U.S. patent application Ser. No. 11/804,492 filed on May 17, 2007, which are hereby incorporated by reference.

Figure 11:
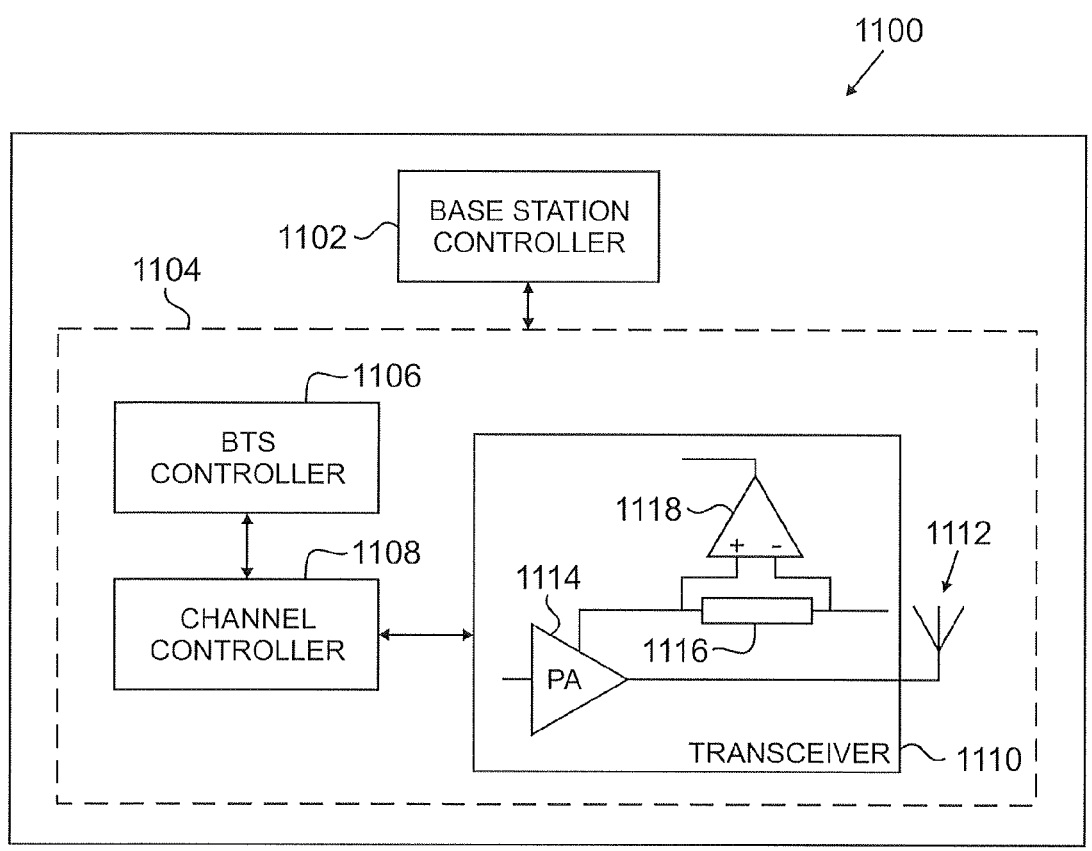
FIG. 11 illustrates a second example system having a chopped auto-zeroed ping-pong amplifier according to this disclosure.

FIG. 11 illustrates a second example system 1100 having a chopped auto-zeroed ping-pong amplifier according to this disclosure. The embodiment of the system 1100 shown in FIG. 11 is for illustration only. Other embodiments of the system 1100 could be used without departing from the scope of this disclosure.

In this example, the system 1100 represents an example base station, which includes a base station controller (BSC) 1102 and one or more base transceiver subsystems (BTS) 1104. The base station controller 1102 generally controls the overall operation of the base station 1100. The base station controller 1102 could, for example, control wireless communication resources in the base station 1100, such as the base transceiver subsystems 1104. The base station controller 1102 includes any hardware, software, firmware, or combination thereof for controlling a base station.

Each base transceiver subsystem 1104 generally includes components used for wireless communications to and from the base station 1100. In this example, each base transceiver subsystem 1104 includes a base transceiver subsystem (BTS) controller 1106, a channel controller 1108, a transceiver 1110, and an antenna 1112. The BTS controller 1106 generally controls the base transceiver subsystem 1104 and communicates with the base station controller 1102. The BTS controller 1106 includes any hardware, software, firmware, or combination thereof for controlling a base transceiver subsystem.

During wireless communications, the channel controller 1108 generally controls communication channels for communicating with wireless devices, such as forward (outbound) and reverse (inbound) channels. The channel controller 1108 includes any hardware, software, firmware, or combination thereof for controlling communication channels in a base transceiver subsystem.

The transceiver 1110 includes any suitable structure supporting wireless transmission of outbound signals and wireless reception of inbound signals, such as a radio frequency (RF) transceiver. As a particular example, the transceiver 1110 could include amplifiers, filters, and analog-to-digital converters for processing inbound signals and amplifiers, filters, and digital-to-analog converters for processing outbound signals. The antenna 1112 represents any suitable structure for transmitting and receiving wireless signals, such as an RF antenna or antenna array.

In this example, the transceiver 1110 includes a power amplifier (PA) 1114, which generally operates to amplify an RF or other signal to be transmitted by the antenna 1112. As shown here, a shunt resistor 1116 can be placed along a positive supply line that provides operating power to the power amplifier 1114, and an amplifier 1118 can measure the voltage across the shunt resistor 1116. The output of the amplifier 1118 could be provided back to one of the controllers 1102, 1106, 1108 (possibly after being fed through an ADC). This may allow one of the controllers to, for example, control the emitter power of the base transceiver subsystem 1104 or the base station 1100. The amplifier 1118 here could represent a chopped auto-zeroed ping-pong amplifier, such as the amplifier 100 described above.

Although FIG. 11 illustrates a second example system 1100 having a chopped auto-zeroed ping-pong amplifier, various changes may be made to FIG. 11. For example, FIG. 11 merely illustrates an example way in which a chopped auto-zeroed ping-pong amplifier could be used. The chopped auto-zeroed ping-pong amplifier could be used in any other or additional manner, such as when the amplifier is used with a shunt or sense resistor in any other suitable device or system.

Figure 12:
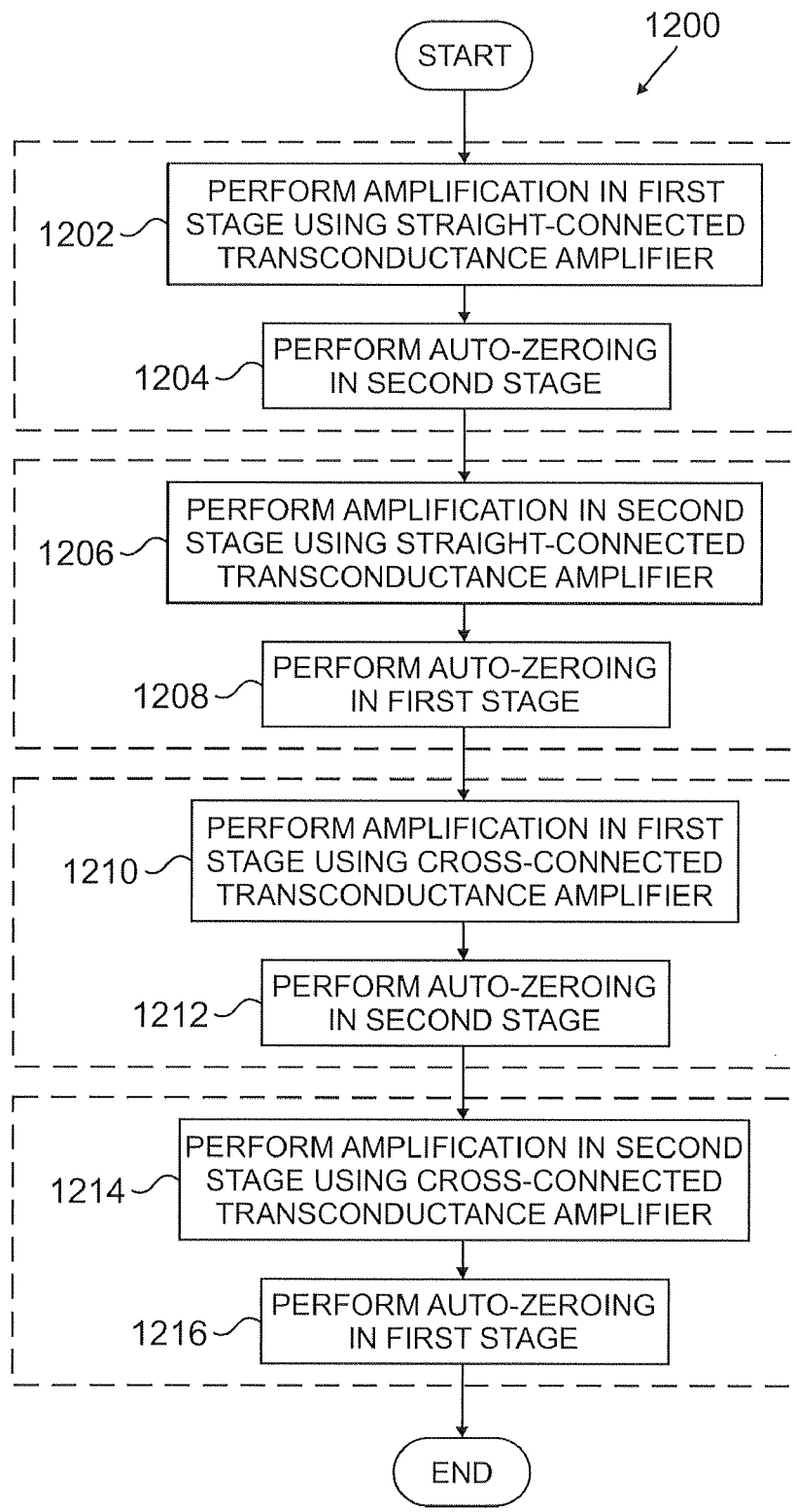
FIG. 12 illustrates an example method for chopped auto-zeroed ping-pong amplification according to this disclosure.

FIG. 12 illustrates an example method 1200 for chopped auto-zeroed ping-pong amplification according to this disclosure. The embodiment of the method 1200 shown in FIG. 12 is for illustration only. Other embodiments of the method 1200 could be used without departing from the scope of this disclosure. Also, for ease of explanation, the method 1200 is described with respect to the chopped auto-zeroed ping-pong amplifier 100 of FIG. 1. The same or similar method could be used with the chopped auto-zeroed ping-pong amplifier 700 of FIG. 7 or other chopped auto-zeroed ping-pong amplifier.

The method 1200 is generally divided into four sections. In the first section, amplification is performed in a first amplifier stage using a straight-connected transconductance amplifier at step 1202, and a second amplifier stage is auto-zeroed at step 1204. This could include, for example, the transconductance stage 102 performing the amplification and its associated switches performing the straight connecting. This could also include the transconductance stage 104 undergoing auto-zeroing using the transconductance stage 124.

In the second section, amplification is performed in the second amplifier stage using a straight-connected transconductance amplifier at step 1206, and the first amplifier stage is auto-zeroed at step 1208. This could include, for example, the transconductance stage 104 performing the amplification and its associated switches performing the straight connecting. This could also include the transconductance stage 102 undergoing auto-zeroing using the transconductance stage 122.

In the third section, amplification is performed in the first amplifier stage using a cross-connected transconductance amplifier at step 1210, and the second amplifier stage is auto-zeroed at step 1212. In the fourth section, amplification is performed in the second amplifier stage using a cross-connected transconductance amplifier at step 1214, and the first amplifier stage is auto-zeroed at step 1216.

The switching between straight- and cross-connections in the amplifying stages is equivalent to chopping the amplifier at a frequency equal to one-half the auto-zeroing frequency.

Although FIG. 12 illustrates an example method 1200 for chopped auto-zeroed ping-pong amplification, various changes may be made to FIG. 12. For example, the steps in FIG. 12 could occur multiple times, such as when the method 1200 is repeated multiple times. Moreover, the order of straight- and cross-connecting may be changed as long as each stage is alternately straight-connected and cross-connected.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising a plurality of amplifier stages, the amplifier stages configured to receive an input voltage and generate an amplified output current, each amplifier stage comprising:
   a transconductance stage configured to receive the input voltage and generate a first intermediate output current;
   an auto-zeroing loop configured to generate a second intermediate output current that at least partially corrects for an offset of the transconductance stage, the auto-zeroing loop configured to operate at a first frequency; and
   chopping circuitry configured to reverse a polarity of the input voltage and a polarity of the amplified output current at a second frequency, the second frequency less than the first frequency;
   wherein each amplifier stage is configured to operate in auto-zeroing and amplification phases, and wherein at least one amplifier stage operates in the auto-zeroing phase when at least one other amplifier stage operates in the amplification phase.

2. The apparatus of claim 1, wherein the second frequency is half the first frequency.

3. The apparatus of claim 1, wherein:
   in each amplifier stage, the transconductance stage comprises a first transconductance stage; and
   the auto-zeroing loop in each amplifier stage comprises:
      an integrator configured to receive the first intermediate output current and generate a second input voltage;
      a second transconductance stage configured to receive the second input voltage and generate the second intermediate output current; and
      at least one switch configured to selectively couple at least one output of the first transconductance stage to the integrator.

4. The apparatus of claim 3, wherein each amplifier stage further comprises:
   a switch coupled across inputs of the first transconductance stage and configured to selectively short the inputs of the first transconductance stage during the auto-zeroing phase.

5. The apparatus of claim 1, wherein the chopping circuitry in each amplifier stage comprises:
   a first set of switches configured to pass the input voltage to the transconductance stage and to selectively reverse the polarity of the input voltage; and
   a second set of switches configured to pass the amplified output current and to selectively reverse the polarity of the amplified output current.

6. The apparatus of claim 5, wherein each amplifier stage further comprises:
   a switch coupled across outputs of the transconductance stage and configured to selectively short the outputs of the transconductance stage during a settling phase between the auto-zeroing and amplification phases, wherein a spike in the amplified output current caused by closing a subset of the first and second sets of switches is at least partially reduced during the settling phase.

7. The apparatus of claim 1, wherein each amplifier stage further comprises:
   pre-charging circuitry configured to charge an input capacitance associated with the transconductance stage during a settling phase between the auto-zeroing and amplification phases; and
   a set of switches configured to selectively control a polarity of the charge on the input capacitance.

8. The apparatus of claim 1, wherein:
in each amplifier stage, the transconductance stage comprises a first transconductance stage configured to receive a first input voltage;
each amplifier stage further comprises a second transconductance stage configured to receive a second input voltage; and
the chopping circuitry in each amplifier stage is configured to reverse the polarity of the first input voltage and a polarity of the second input voltage.

9. The apparatus of claim 8, wherein:
the apparatus comprises an instrumentation amplifier;
the amplifier stages form at least a portion of a differential difference amplifier in the instrumentation amplifier; and
the differential difference amplifier is configured to receive the first input voltage from a signal source and the second input voltage from gain control circuitry and to amplify a difference between the first and second input voltages.

10. A system comprising:
a signal source configured to provide an input voltage; and
an amplifier comprising a plurality of amplifier stages, the amplifier configured to receive the input voltage and generate an amplified output current, each amplifier stage comprising:
  a transconductance stage configured to receive the input voltage and generate a first intermediate output current;
  an auto-zeroing loop configured to generate a second intermediate output current that at least partially corrects for an offset of the transconductance stage, the auto-zeroing loop configured to operate at a first frequency; and
  chopping circuitry configured to reverse a polarity of the input voltage and a polarity of the amplified output current at a second frequency, the second frequency less than the first frequency;
  wherein each amplifier stage is configured to operate in auto-zeroing and amplification phases, and wherein at least one amplifier stage operates in the auto-zeroing phase when at least one other amplifier stage operates in the amplification phase.

11. The system of claim 10, wherein the second frequency is half the first frequency.

12. The system of claim 10, wherein:
in each amplifier stage, the transconductance stage comprises a first transconductance stage; and
the auto-zeroing loop in each amplifier stage comprises:
  an integrator configured to receive the first intermediate output current and generate a second input voltage;
  a second transconductance stage configured to receive the second input voltage and generate the second intermediate output current; and
  at least one switch configured to selectively couple at least one output of the first transconductance stage to the integrator.

13. The system of claim 10, wherein the chopping circuitry in each amplifier stage comprises:
a first set of switches configured to pass the input voltage to the transconductance stage and to selectively reverse the polarity of the input voltage; and
a second set of switches configured to pass the amplified output current and to selectively reverse the polarity of the amplified output current.

14. The system of claim 10, wherein each amplifier stage further comprises:
pre-charging circuitry configured to charge an input capacitance associated with the transconductance stage during a settling phase between the auto-zeroing and amplification phases; and
a set of switches configured to selectively control a polarity of the charge on the input capacitance.

15. The system of claim 10, wherein:
in each amplifier stage, the transconductance stage comprises a first transconductance stage configured to receive a first input voltage from the signal source;
each amplifier stage further comprises a second transconductance stage configured to receive a second input voltage; and
the chopping circuitry in each amplifier stage is configured to reverse the polarity of the first input voltage and a polarity of the second input voltage.

16. The system of claim 15, wherein:
the amplifier comprises a differential difference amplifier in an instrumentation amplifier; and
the differential difference amplifier is configured to receive the first input voltage from the signal source and the second input voltage from gain control circuitry and to amplify a difference between the first and second input voltages.

17. The system of claim 16, wherein the signal source comprises a shunt or sense resistor.

18. The system of claim 17, further comprising:
a power amplifier configured to amplify a signal for transmission by an antenna, wherein the shunt or sense resistor is coupled along a positive supply line of the power amplifier; and
a controller configured to control an emitter power in a base station based on an output from the amplifier.

19. The system of claim 16, wherein:
the signal source comprises a sensor; and
the differential difference amplifier is configured to receive the first input voltage from the sensor.

20. A method comprising:
at each of a plurality of amplifier stages, receiving and amplifying an input voltage to produce an amplified output current during an amplification phase;
auto-zeroing each amplifier stage to at least partially correct for an offset of each amplifier stage during an auto-zeroing phase, the auto-zeroing occurring at a first frequency, wherein at least one amplifier stage operates in the auto-zeroing phase when at least one other amplifier stage operates in the amplification phase; and
chopping the input voltage and the amplified output current in each amplifier stage to reverse a polarity of the input voltage and a polarity of the amplified output current, wherein the chopping occurs at a second frequency that is less than the first frequency.

* * * * *